United States Patent
Hsu et al.

(10) Patent No.: US 9,117,847 B2
(45) Date of Patent: Aug. 25, 2015

(54) METHOD FOR FABRICATING SEMICONDUCTOR DEVICE

(71) Applicant: UNITED MICROELECTRONICS CORP., Hsin-Chu (TW)

(72) Inventors: Cheng-Yuan Hsu, Hsinchu (TW); Chi Ren, Singapore (SG); Tzeng-Fei Wen, Hsinchu County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/516,592

(22) Filed: Oct. 17, 2014

(65) Prior Publication Data

US 2015/0056768 A1 Feb. 26, 2015

Related U.S. Application Data

(62) Division of application No. 13/549,510, filed on Jul. 15, 2012, now Pat. No. 8,890,230.

(51) Int. Cl.
| | |
|---|---|
| *H01L 21/06* | (2006.01) |
| *H01L 29/66* | (2006.01) |
| *H01L 29/423* | (2006.01) |
| *H01L 29/788* | (2006.01) |
| *H01L 21/28* | (2006.01) |
| *H01L 27/115* | (2006.01) |
| *H01L 21/266* | (2006.01) |

(52) U.S. Cl.
CPC ........ *H01L 29/66825* (2013.01); *H01L 21/266* (2013.01); *H01L 21/28273* (2013.01); *H01L 27/11521* (2013.01); *H01L 29/42324* (2013.01); *H01L 29/42328* (2013.01); *H01L 29/42332* (2013.01); *H01L 29/6653* (2013.01); *H01L 29/6656* (2013.01); *H01L 29/7881* (2013.01); *H01L 29/7882* (2013.01)

(58) Field of Classification Search
CPC ............ H01L 21/336; H01L 27/11521; H01L 27/11524; H01L 29/78; H01L 29/7881; H01L 29/42336
USPC .......... 438/258, 266, 594; 257/E21.068, 422, 257/27.103, 29.264
See application file for complete search history.

(56) References Cited

U.S. PATENT DOCUMENTS

| | | |
|---|---|---|
| 6,215,688 B1 | 4/2001 | Pio |
| 6,355,527 B1 | 3/2002 | Lin |
| 6,852,596 B2 | 2/2005 | Pio |
| 7,238,983 B2 | 7/2007 | Ding |
| 7,247,907 B2 | 7/2007 | Gao |
| 7,315,057 B2 | 1/2008 | Jeon |
| 7,544,569 B2 | 6/2009 | Gao |

(Continued)

*Primary Examiner* — Michael Lebentritt
(74) *Attorney, Agent, or Firm* — Winston Hsu; Scott Margo

(57) ABSTRACT

A method of fabricating a semiconductor device is disclosed. The method includes the steps of: sequentially forming agate dielectric layer and a first gate layer on a semiconductor substrate, wherein the gate dielectric layer is between the first gate layer and the semiconductor substrate; forming at least an opening in the first gate layer; forming a first dielectric layer conformally on the semiconductor substrate wherein the first dielectric layer covers the first gate layer; and forming a second gate layer filling the opening and overlapping the first gate layer.

10 Claims, 10 Drawing Sheets

(56) References Cited

U.S. PATENT DOCUMENTS

| | | |
|---|---|---|
| 7,601,590 B2 | 10/2009 | Pio |
| 7,723,774 B2 | 5/2010 | Chen |
| 7,927,994 B1 | 4/2011 | Liu |
| 8,164,135 B2 | 4/2012 | Chen |
| 8,890,230 B2 * | 11/2014 | Hsu et al. .................. 257/315 |
| 2005/0122778 A1 | 6/2005 | Pio |
| 2008/0315284 A1 | 12/2008 | Hsiao |
| 2009/0020801 A1 | 1/2009 | Liao |

* cited by examiner

METHOD FOR FABRICATING SEMICONDUCTOR DEVICE

CROSS REFERENCE TO RELATED APPLICATIONS

This application is a division of U.S. application Ser. No. 13/549,510 filed Jul. 15, 2012, and incorporated herein by reference in its entirety.

BACKGROUND OF THE INVENTION

1. Field of the Invention

The present invention relates to a semiconductor device and a method of fabricating the same, and more particularly to a semiconductor device having a high gate coupling ratio (GCR) and a method of fabricating the same.

2. Description of the Prior Art

A flash memory is a non-volatile memory, which can preserve data within the memory even when an external power supply is off. Recently, because the flash memories are re-writable and re-erasable, they has been widely applied in the fabrication of electrical products, such as mobile phones, digital cameras, video players, personal digital assistants (PDA) or systems on a chip (SOC).

With the trend of miniaturization of the electronic products, the smaller size of the flash memory cell 10 reduces the gate coupling ratio (GCR). Consequently, how to improve the GCR to improve the performances of the flash memory cell is still an important issue in the field

SUMMARY OF THE INVENTION

An objective of the present invention is therefore to provide a semiconductor device having a high gate coupling ratio (GCR) and a method of fabricating the same in order to improve the semiconductor device performances.

According to one exemplary embodiment of the present invention, a semiconductor device is provided. The semiconductor device includes two floating gates, a control gate and a first dielectric layer. The floating gates are disposed on the semiconductor substrate. The control gate partially overlaps each of the floating gates, and a part of the control gate is disposed between the two floating gates. Furthermore, the first dielectric layer disposed between the two floating gates and the control gate has a fixed thickness.

According to another exemplary embodiment of the present invention, a method of fabricating a semiconductor device includes the following steps. At first, a gate dielectric layer and a first gate layer are sequentially formed on a semiconductor substrate, and the gate dielectric layer is between the first gate layer and the semiconductor substrate. At least an opening is further formed in the first gate layer. Then, a first dielectric layer is conformally formed on the semiconductor substrate, and the first dielectric layer covers the first gate layer. Subsequently, a second gate layer if formed to fill the opening and overlap the first gate layer.

In the present invention, a T-shaped control gate may simultaneously overlap a top and a sidewall of each of the two floating gates, contrary to the structure of the control gate that only overlaps a top of a floating fate, the control gate structure design of the present invention can therefore increase the overlapped area between the floating gate and the control gate, and the GCR increases as well. Accordingly, the operation voltage of the semiconductor device may be reduced and the performances of the semiconductor device can be improved. Furthermore, only the first dielectric layer is conformally disposed between each of the floating gates and the control gate, and the first dielectric layer has a fixed thickness, so that an interval between each of the floating gates and the control gate is fixed, and a stable capacitance could be obtained.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
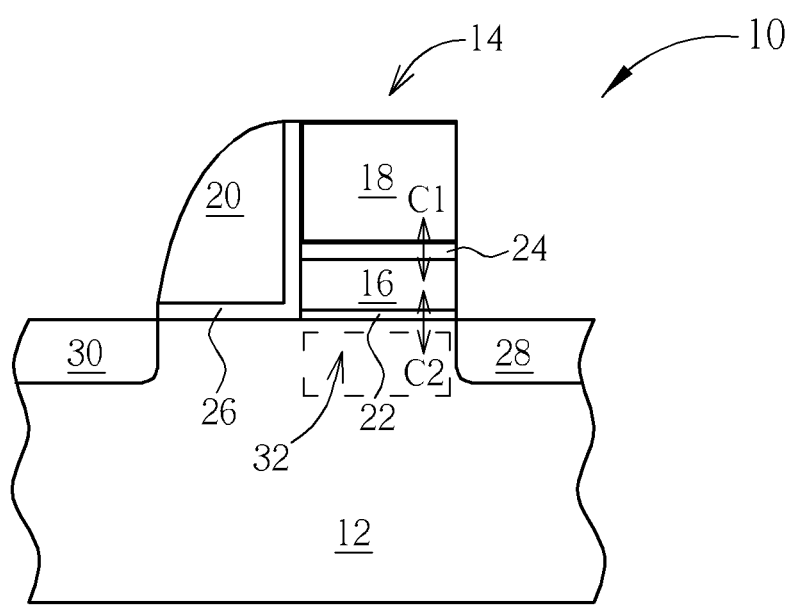
FIG. 1 is a cross-sectional diagram illustrating a semiconductor device according to an exemplary embodiment of the present invention.

Please refer to FIG. 1, which is a cross-sectional diagram illustrating a semiconductor device according to an exemplary embodiment of the present invention. As shown in FIG. 1, a semiconductor device 10, such as a flash memory cell, includes a semiconductor substrate 12, a gate stack 14 disposed on the semiconductor substrate 12, and a select gate 20 disposed at a side of the gate stack 14. The gate stack 14 includes a floating gate 16 and a control gate 18. The semiconductor substrate 12 may include a substrate composed of Si, AsGa, silicon on insulator (SOI) layer, epitaxial layer, SiGe layer or other semiconductor materials. The floating gate 16, the control gate 18 and the select gate 20 are commonly made of polysilicon, and the dielectric layers 22/24/26 such as oxide layers are disposed between the gates for electric insulation. The semiconductor device 10 further includes source/drain regions 28/30 disposed in the semiconductor substrate 12 at two sides of the gate stack 14, and a channel region 32 defined in the semiconductor substrate 12 between the source/drain regions 28/30. Furthermore, the dielectric layers 22 between the floating gate 16 and the semiconductor substrate 12 may serve as a tunneling oxide, and the hot electrons through the dielectric layers 22 get in or out of the floating gate 16, thereby achieving data accessing.

Generally speaking, the gate coupling ratio (GCR) is an index that is usually used to evaluate the performance of the flash memory cell. A high GCR indicates a low operation voltage needed for the programming operations or the erase operations of the flash memory cell and good performances of the flash memory cell. The gate coupling ratio of the flash memory cell is defined as:

$$GCR=C1/(C1+C2)$$

In which C1 represents the capacitance between the floating gate 16 and the control gate 18, and C2 represents the capacitance between the floating gate 16 and the channel region 32 in the semiconductor substrate 12. According to the illustrated equation, The GCR can be elevated by increasing C1 and/or decreasing C2, wherein the capacitance is proportional to the overlapped area where the capacitance is induced. Accordingly, C1 may be increased by enlarging the overlapped area between the floating gate 16 and the control gate 18, so that the GCR can be further enhanced.

Figure 2:
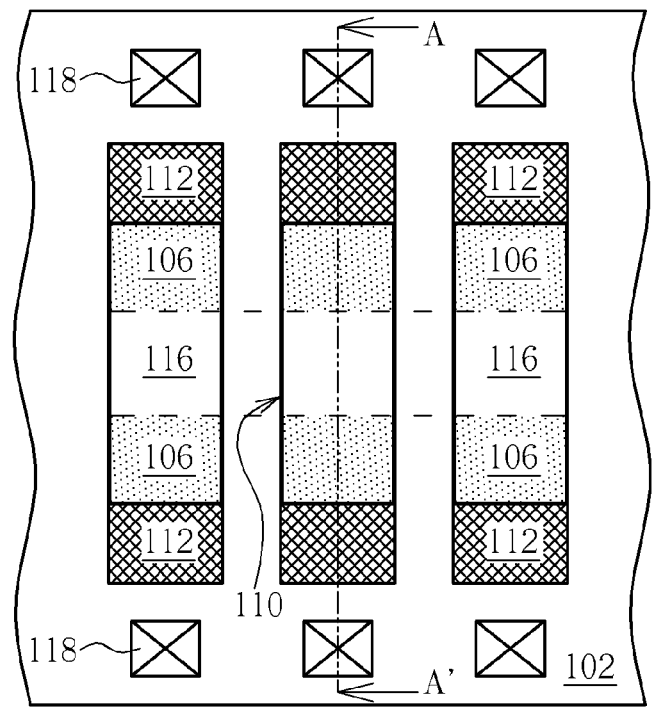
FIG. 2 illustrates a layout of semiconductor device according to a preferred exemplary embodiment of the present invention.
Figure 3:
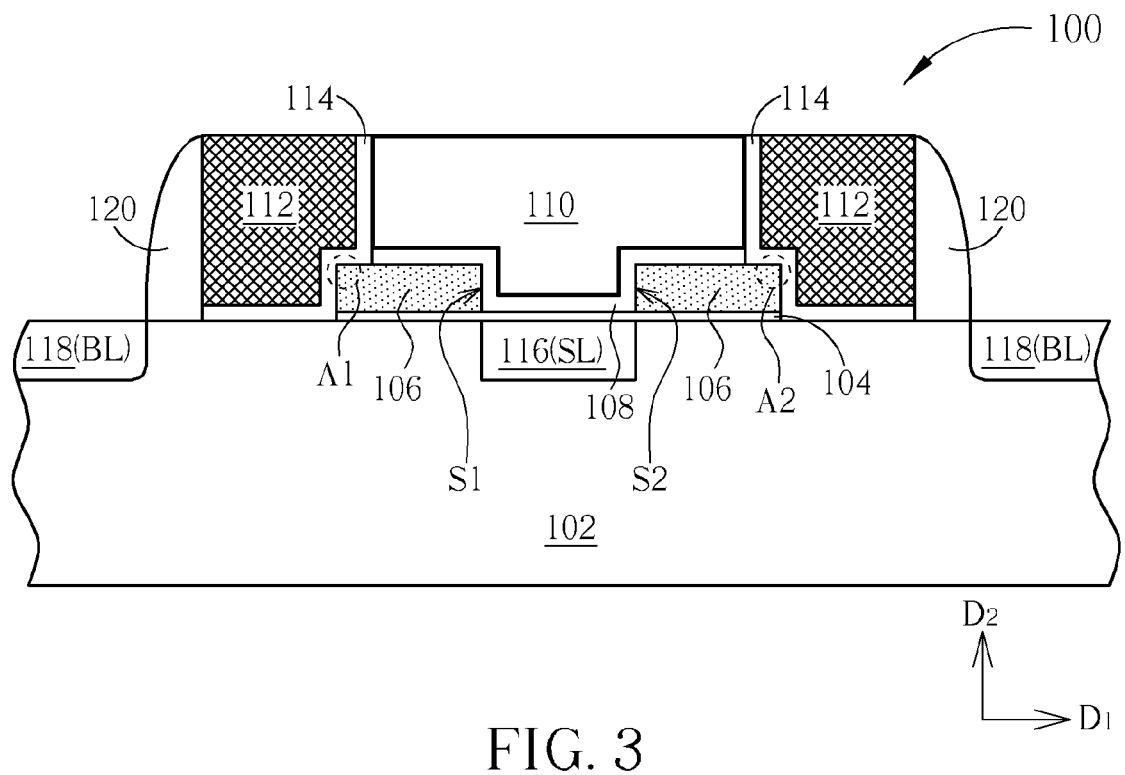
FIG. 3 is a cross-sectional view taken along the line A-A' of FIG. 2 illustrating a semiconductor device according to a preferred exemplary embodiment of the present invention.

In order to improve GCR, the prevention provides a semiconductor device, please refer to FIG. 2 and FIG. 3. FIG. 2 illustrates a layout of semiconductor device according to a preferred exemplary embodiment of the present invention. FIG. 3 is a cross-sectional view taken along the line A-A' of FIG. 2 illustrating a semiconductor device according to a preferred exemplary embodiment of the present invention. Furthermore, FIG. 2 is a top-view schematic diagram, wherein some components in FIG. 3 are not illustrated in order to clearly show the relative positions of the main components.

As shown in FIG. 2 and FIG. 3, the semiconductor device 100, such as a flash memory cell, includes a gate dielectric layer 104, at least two floating gates 106, a first dielectric layer 108 and a control gate 110 disposed sequentially on a semiconductor substrate 102. The semiconductor substrate 102 includes a substrate composed of Si, AsGa, silicon on insulator (SOI) layer, epitaxial layer, SiGe layer or other semiconductor materials. The gate dielectric layer 104 and the first dielectric layer 108 may be made of dielectric material such as silicon oxide, silicon oxynitride, or other high-k dielectric layers with a dielectric constant larger than 4. The gate dielectric layer 104 disposed between each of the floating gates 106 and the semiconductor substrate 102 may serve as a tunneling oxide layer, and the hot electrons could get in or get out of the floating gates 106 through the gate dielectric layer 104, thereby providing data access in the semiconductor device 100. Furthermore, the first dielectric layer 108 disposed between the two floating gates 106 and the control gate 110 could be a single layered structure or a multi-layered structure such as oxide-nitride-oxide (ONO) stacked layer, and serve as an inter-gate dielectric layer for electric insulation. The floating gates 106 and the control gate 110 are made of conductive material such as polysilicon, metal silicide or metal layer with specific work function. Moreover, the floating gates 106 may be used to store hot electrons, and the control gate 110 may be used to control the data access function of the semiconductor device 100.

It is appreciated that the control gate 110 is a T-shaped control gate, and the control gate 110 simultaneously partially overlaps the two floating gates 106, and a part of the control gate 110 is disposed between the two floating gates 106. In other words, the control gate 110 may simultaneously overlap a partial top of each of the floating gates 106, the opposite sidewalls S1/S2 of the two floating gates 106 and the semiconductor substrate 102 between the two floating gates 106. Accordingly, compared to the semiconductor device 10, in this exemplary embodiment, the control gate 110 not only overlaps the top of each of the two floating gates 106 along the first direction D1 like the control gate 18 overlaps the top of the floating gates 106, but also totally overlaps the opposite sidewalls S1/S2 of the two floating gates 106 so as to increase the overlapped area between the floating gate 106 and the control gate 110, which may further enhance the gate coupling ratio (GCR).

In addition, in the semiconductor device 100, only the first dielectric layer 108 is disposed between each of the floating gates 106 and the control gate 110, and the first dielectric layer 108 is conformally disposed on each of the floating gates 106 and the semiconductor substrate 102. More specifically, the first dielectric layer 108 contacts the top of each of the floating gates 106, a sidewall S1/S2 of each of the floating gates 106 and a bottom of the control gate 110, and overlaps the semiconductor substrate 102 between the two floating gates 106. Furthermore, the sidewalls S1/S2 of the floating gates 106 contacted by the first dielectric layer 108 face each other. In the other exemplary embodiments, the first dielectric layer 108 disposed between the control gate 110 and each of the floating gates 106 may directly contact the semiconductor substrate 102. Moreover, in this exemplary embodiment, the first dielectric layer 108 is parallel to the surfaces of each of the floating gates 106 that the first dielectric layer 108 contacts, and the first dielectric layer 108 has a fixed thickness, therefore, an interval between each of the floating gates 106 and the control gate 110 is fixed.

The semiconductor device 100 further includes two select gates 112 respectively disposed at a side of each of the floating gates 106 and the control gate 110. The select gates 112 are made of conductive material such as polysilicon, metal silicide or metal layer with specific work function may be used to assist the control of the data access function of the semiconductor device 100. Dislike the select gate 20 of the semiconductor device 10 having an arched surface, in this exemplary embodiment, each of the select gates 112 includes a planar top, and the top of each of the select gates 112 is parallel to a top of each of the floating gates 106 and a top of the control gate 110. Furthermore, each of the select gates 112 includes a reverse L-shaped structure and partially overlaps each corresponding floating gate 106, i.e. each of the select gates 112 may overlap the corner A1/A2 and a part of the top of the corresponding floating gate 106. When the semiconductor device 100, such as a flash memory cell, performs an erase operation, a part of the hot electrons stored in the floating gate 106 may be released to the select gate 112 through the corner A1/A2. Accordingly, the operation voltage and the processing time needed for the erase operation of the semiconductor device 100 may be reduced.

Moreover, two second dielectric layers 114 respectively disposed between each of the select gates 112 and each of the floating gates 106 and between each of the select gates 112 and the control gate 110 may serve as an inter-gate dielectric layer for electric insulation. Furthermore, the gate dielectric layer 104, the first dielectric layer 108 and each of the second dielectric layers 114 surround each corresponding floating gate 106 jointly.

Additionally, a first doped region 116 and two second doped regions 118 may serve as source/drain regions of the semiconductor device 100. The first doped region 116 is disposed in the semiconductor substrate 102 between the two floating gates 106, and the control gate 110 overlaps the first doped region 116. The two second doped regions 118 are respectively disposed in the semiconductor substrate 102 at another side of each of the floating gates 106 with respect to the first doped region 116, i.e. the second doped regions 118 are disposed in the semiconductor substrate 102 at both sides of the two floating gates 106. In this exemplary embodiment, the first doped region 116 is electrically connected to a source line (SL), and the second doped regions 118 are respectively electrically connected to a bit line (BL). Furthermore, two spacers 120 made of dielectric material could be respectively disposed on the semiconductor substrate 102 between the select gate 112 and the second doped region 118 to adjust the distance between the first doped region 116 and the second doped region 118, i.e. the length of the channel region for hot electrons, and to prevent the signals applied to the select gate 112 and the second doped region 118 from interfere with each other, Please refer to Table. 1 and to FIG. 3 together. Table. 1 illustrates a reference of operation conditions of a semiconductor device according to a preferred exemplary embodiment of the present invention. As shown in Table. 1, as the semiconductor device 100 performs different operation, such as programming, erase or read, specific signals, such as voltage or current, are respectively applied to each of the terminals, such as the select gate 112, the second doped regions 118 electrically connected to BL, the first doped region 116 electrically connected to SL, or the control gate 110. For example, as the semiconductor device 100 is selected to perform a programming operation, a first positive voltage, such as +8 volts (V) voltage, is applied to the control gate 110, and the first positive voltage could be electrically coupled to the floating gates 106. Furthermore, a second positive voltage, such as +2.5 V voltage, is applied to the select gate 112, a third positive voltage, such as +4.5 V voltage, is applied to the SL. i.e. the first doped region 116, and a current, such as 1 microampere (μA) current, is applied to the BL. i.e. the second doped regions 118. Accordingly, hot electrons are formed in the channel region between the first doped region 116 and the second doped region 118, and the difference of electric potential between the control gate 110 and the channel region could induce an electric field crossing through the gate dielectric layer 104. The hot electrons can therefore get in the floating gate 106 through the gate dielectric layer 104, thereby achieving the programming operation. As other semiconductors are selected to perform programming operations, and the semiconductor device 100 is not selected, the same voltage Vcc is applied to the select gate 110 and the BL, while the select gate 112 and the SL are grounded to keep the voltage at 0V.

TABLE 1

| Operation | Status | Operation Condition of Terminals | | | |
| | | Select gate | Bit Line (BL) | Source Line (SL) | Control gate |
|---|---|---|---|---|---|
| Programming | Selected | 2.5 V | 1 μA | 4.5 V | 7 V-8 V |
| | Unselected | 0 V | Vcc | 0 V | Vcc |
| Erase | Selected | 10 V | 0 V | 0 V | 0 V |
| | Unselected | 0 V | 0 V | 0 V | 0 V |
| Read | Selected | 2.5 V | 0.8 V | 0 V | 2.5 V |
| | Unselected | 0 V | 0 V | 0 V | 2.5 V |

Figure 4:
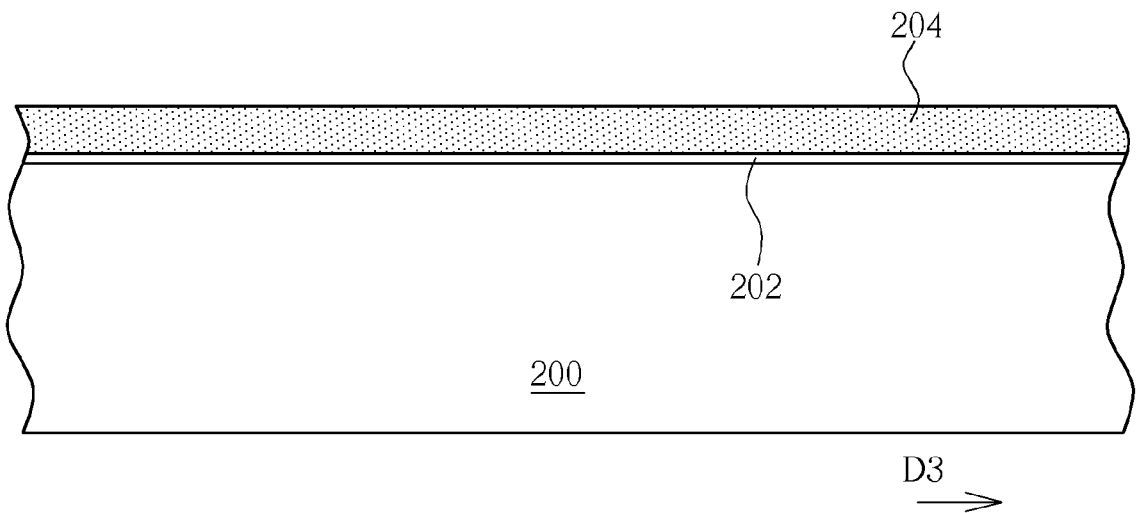
FIG. 4 through FIG. 14 are schematic diagrams illustrating a method of fabricating a semiconductor device according to a preferred exemplary embodiment of the present invention.

The present invention also provides a method for fabricating a semiconductor device 100 as illustrated above. Please refer to FIG. 4 through FIG. 14, FIG. 4 through FIG. 14 are schematic diagrams illustrating a method of fabricating a semiconductor device according to a preferred exemplary embodiment of the present invention. As shown in FIG. 4, at first, a gate dielectric layer 202 and a first gate layer 204 are sequentially formed on a semiconductor substrate 200, i.e. the gate dielectric layer 202 is between the first gate layer 204 and the semiconductor substrate 200. The semiconductor substrate 200 includes a substrate composed of Si, AsGa, silicon on insulator (SOI) layer, epitaxial layer, SiGe layer or other semiconductor materials. The gate dielectric layer 202 could be made of dielectric material such as silicon oxide, silicon oxynitride, or other high-k dielectric layers with a dielectric constant larger than 4 formed through a thermal oxidation process or a deposition process such as a chemical vapor deposition (CVD) process or an atomic layer deposition (ALD) process. In this exemplary embodiment, the gate dielectric layer 202 is made of silicon oxide formed through a thermal oxidation process. The first gate layer 204 made of conductive materials such as polysilicon, metal silicide or metal layer with specific work functions, for example, the first gate layer 204 made of polysilicon formed through a low pressure CVD (LPCVD) process or a plasma-enhanced CVD (PECVD) process, and the polysilicon could be in-situ doped during the deposition process according to the process requirement.

Figure 5:
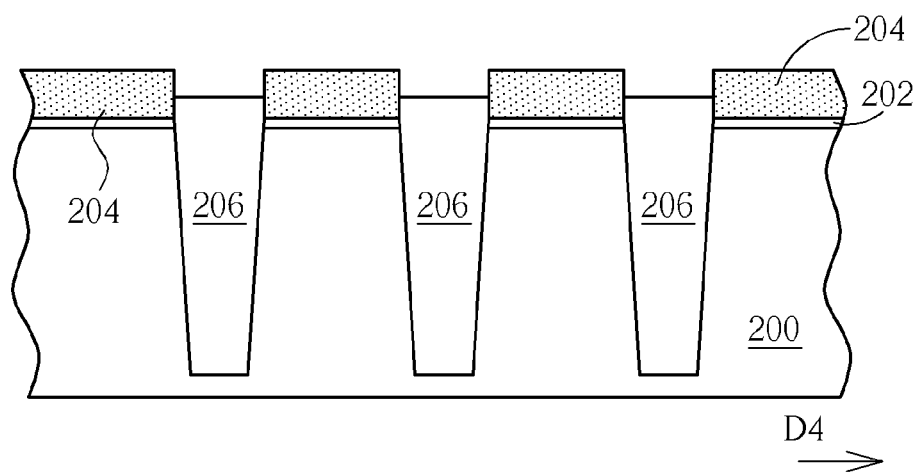

To define the active regions, as shown in FIG. 5, a plurality of shallow trench isolations (STI) 206 protruding to the semiconductor substrate 200 are formed before the formation of the gate dielectric layer 202 and the first gate layer 204, and the direction D3 taken along the cross section in the FIG. 4 is perpendicular to the direction D4 taken along the cross section in the FIG. 5. Subsequently, the gate dielectric layer 202 and the first gate layer 204 are sequentially formed on the semiconductor substrate 200 as previously illustrated in FIG. 4, and a chemical mechanical polishing (CMP) process is performed to remove a part of the first gate layer 204 to define a plurality of active regions predetermined to form the semiconductor devices. In other words, the STIs 206 protruding from the semiconductor substrate 200 may serve as a mask for defining the patterns of the gate dielectric layer 202 and the first gate layer 204. The STIs 206 are commonly made of dielectric material such as silicon oxide, and as the STI processes are known to those skilled in the art, the details are omitted herein for brevity. The shape, locations and the order of formation of STIs are not limited.

Figure 6:
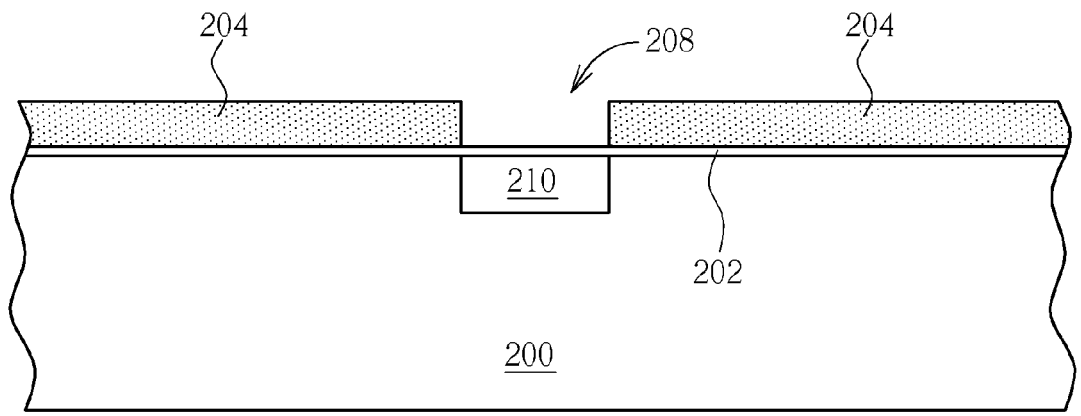

As shown in FIG. 6, at least an opening 208 is formed in the first gate layer 204, and the opening 208 exposes a part of the gate dielectric layer 202 and does not expose the semiconductor substrate 200. After the formation of the opening 208, an ion implantation process is further carried out to form a first doped region 210 in the semiconductor substrate 200 under the gate dielectric layer 202 exposed by the opening 208, and the first doped region 210 could serve as a source/drain region in the later formed semiconductor device. In this exemplary embodiment, the first doped region 210 is electrically connected to a source line (SL). The method of forming the opening 208 includes the following steps. At first, a patterned mask (not shown) is formed on the first gate layer 204, and an etching process, such as an anisotropic etching process or a wet-etching process, with the etchant preferably having selectivity to a material of the first gate layer 204 and a material of the gate dielectric layer 202, is performed to remove a part of the first gate layer 204 to expose the gate dielectric layer 202.

Figure 7:
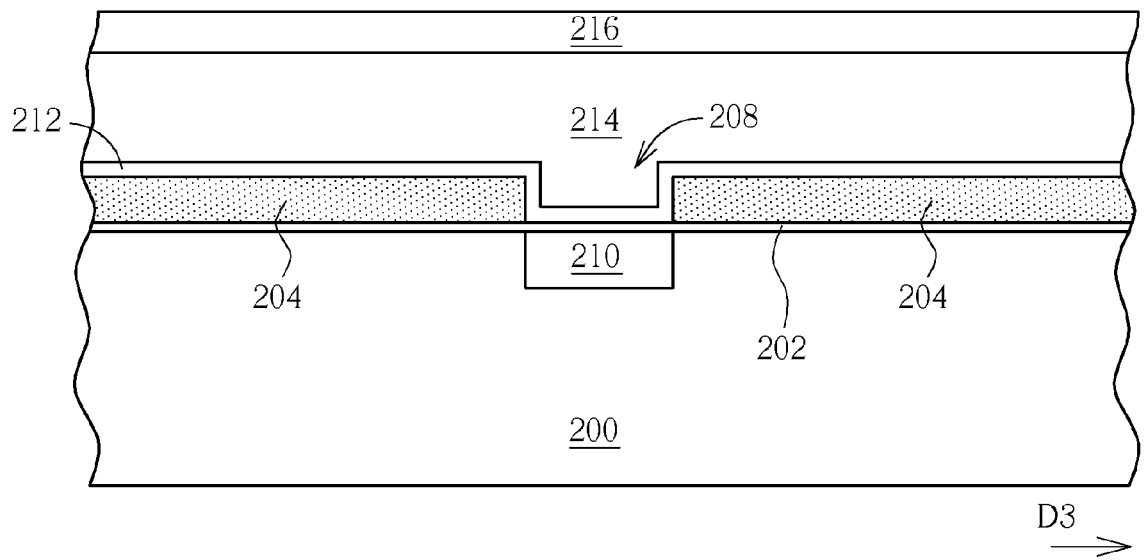
Figure 8:
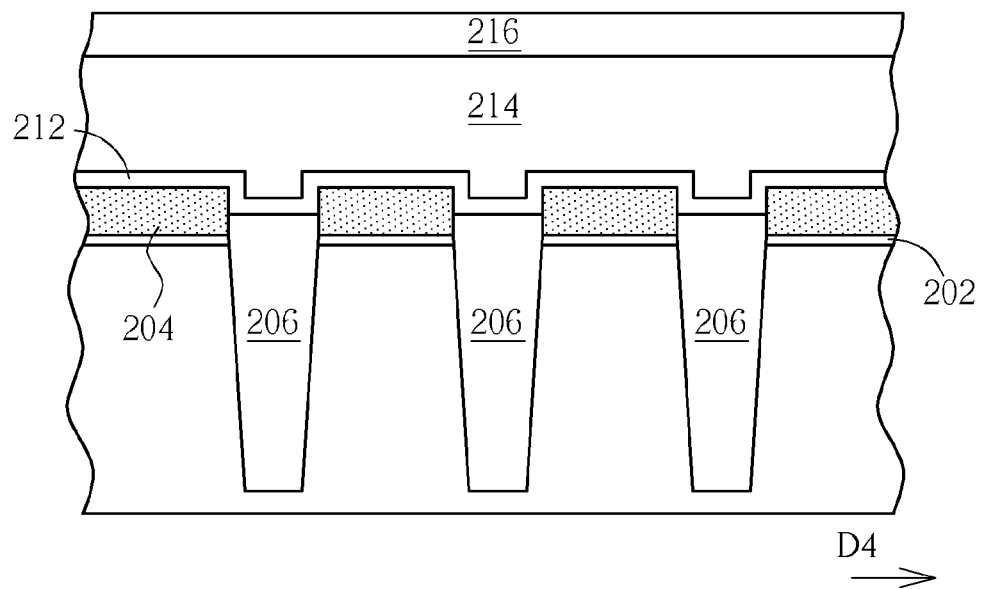

Subsequently, as shown in FIG. 7 and FIG. 8, a first dielectric layer 212 is formed on the overall semiconductor substrate 200, and the first dielectric layer 212 conformally covers the first gate layer 204, the gate dielectric layer 202 exposed by the opening 208, and the exposed STIs 206. The first dielectric layer 212 includes a single layered structure or a multi-layered structure made of dielectric material, for example a multi-layered structure as an oxide-nitride-oxide (ONO) stacked layer sequentially formed through a thermal oxidation process, a thermal nitridation process and a PECVD process, or LPCVD processes. Then, a second gate layer 214 is formed to fill the opening 208 and to overlap the first gate layer 204. The second gate layer 214 may include conductive material such as polysilicon, metal silicide or a metal layer with specific a work function; the second gate layer 214 could be made of polysilicon formed through a deposition process such as a LPCVD process or a PECVD process for example. Afterwards, a mask layer 216 is formed on the second gate layer 214, and the mask layer 216 may be a single layered structure or a multi-layered structure made of anti-oxidation material, such as a nitride layer or a composite layer made of silicon oxide and silicon nitride formed through CVD process.

Figure 9:
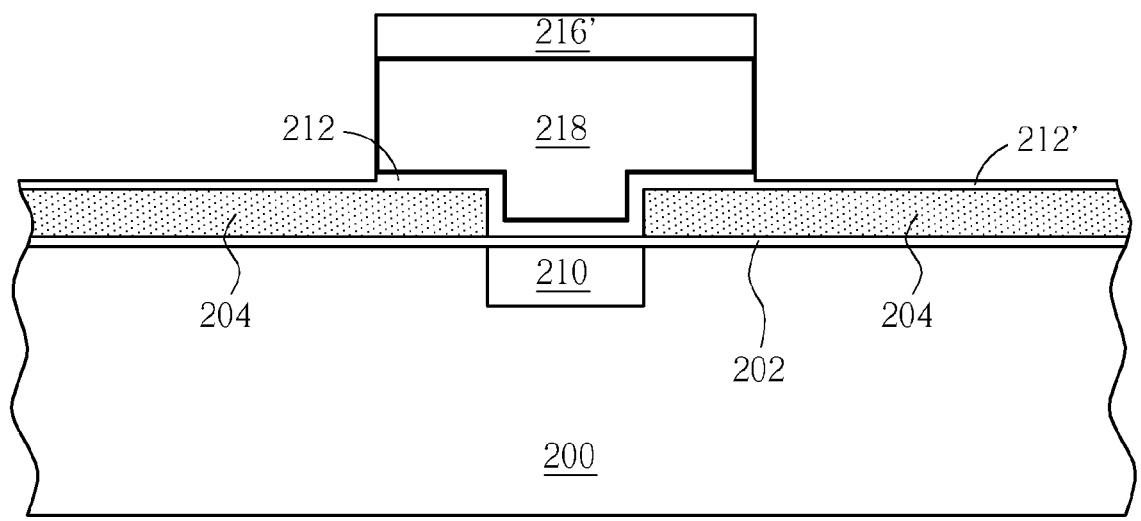

As shown in FIG. 9, the mask layer 216, the second gate layer 214 and the first dielectric layer 212 are patterned to form a control gate 218, and the method for patterning includes the following steps. At first, a lithography process is carried out to form a patterned mask layer 216', and the patterned mask layer 216' layer may further serve as a mask to perform an etching process, such as an anisotropic etching process, to remove a part of the second gate layer 214 and a part of the first dielectric layer 212; or a patterned mask (not shown) is used, and an etching process is performed to remove a part of the mask layer 216, a part of the second gate layer 214 and a part of the first dielectric layer 212. Then, the remaining second gate layer 214 could serve as the control gate 218. Additionally, a part of the first dielectric layer 212', such as the bottom oxide layer of the ONO stacked layer, could be selectively kept on the first gate layer 204 to protect the surface of the first gate layer 204 during the illustrated control gate 218 process.

Figure 10:
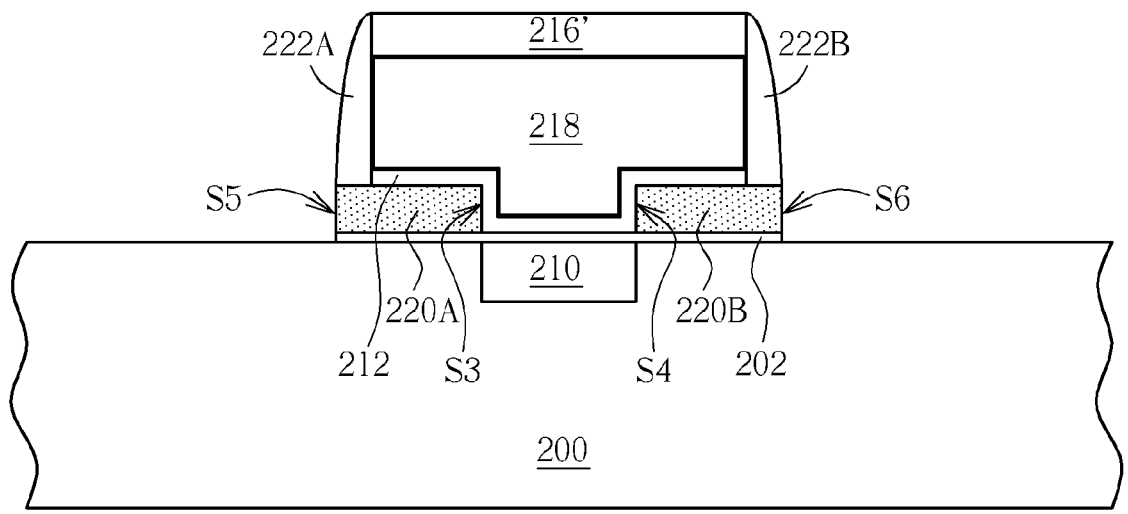

As shown in FIG. 10, a part of the first gate layer 204 is removed to form two floating gates 220A/220B. The method for forming the floating gates 220A/220B includes the following steps. At first, two sacrificial spacers 222 A/222B are formed, and the sacrificial spacers 222 A/222B surround the control gate 218. The sacrificial spacers 222 A/222B could include a single layered structure or a multi-layered structure, or also include a liner within. The material of the sacrificial spacers 222 A/222B may include high temperature oxide (HTO), silicon nitride, silicon oxide or HexaChloroDisilane-SiN (HCD-SiN), but not limited thereto. The sacrificial spacers 222 A/222B processes are known to those skilled in the art, the details are omitted herein for brevity. Subsequently, the patterned mask layer 216', the control gate 218 and the sacrificial spacers 222 A/222B could be used as masks, and an etching process is performed to remove a part of the first gate layer 204 to form two floating gates 220A/220B, that the control gate 218 may partially both overlap. More specifically, the control gate 218 could simultaneously overlap a part of the top of each of the floating gates 220A/220B and the opposite inner sidewalls S3/S4 of the two floating gates 220A/220B. Additionally, the opposite outer sidewalls S5/S6 of the two floating gates 220A/220B are defined through performing an etching process with the mask of the sacrificial spacers 222 A/222B, i.e. a self-aligned etching process.

Figure 11:
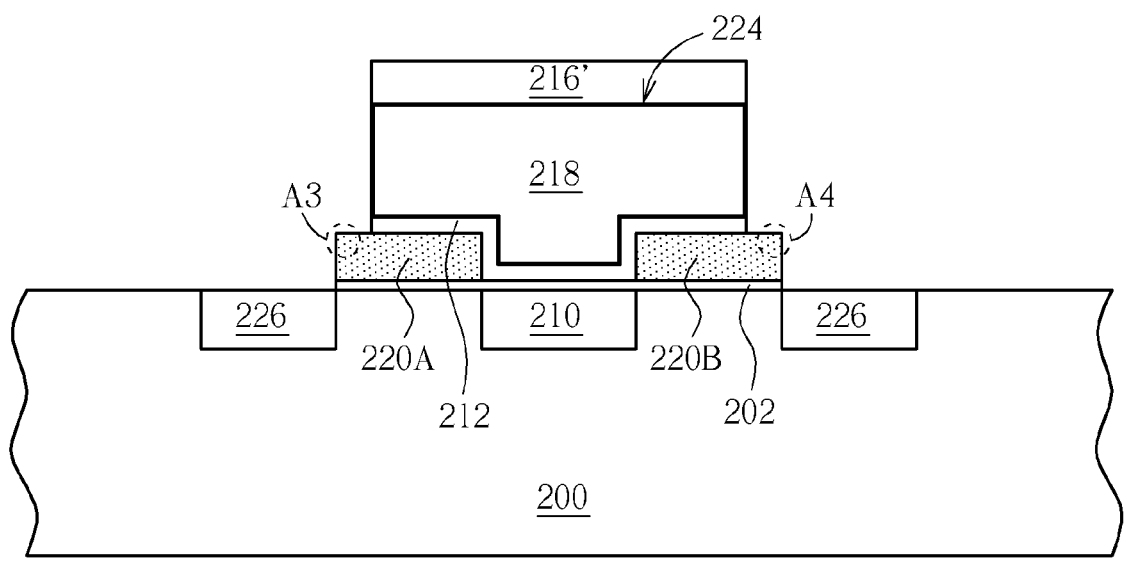

As shown in FIG. 11, the sacrificial spacers 222 A/222B are removed, and the top of each of the floating gates 220A/220B previously covered by each of the sacrificial spacer 222A/222B including the corner A3/A4 is exposed. The covered top area of each of the floating gates 220A/220B is positively related to the bottom area of each of the sacrificial spacers 222 A/222B formed through self-aligning. Accordingly, a gate stack structure 224 including the gate dielectric layer 202, the two floating gates 220A/220B, the first dielectric layer 212 and the control gate 218 are formed. Furthermore, before the formation of the later formed select gate, a doped region 226 can be selectively formed in the semiconductor substrate 200 at the two sides of the gate stack structure 224 for adjusting the performances of the later formed select gate.

Figure 12:
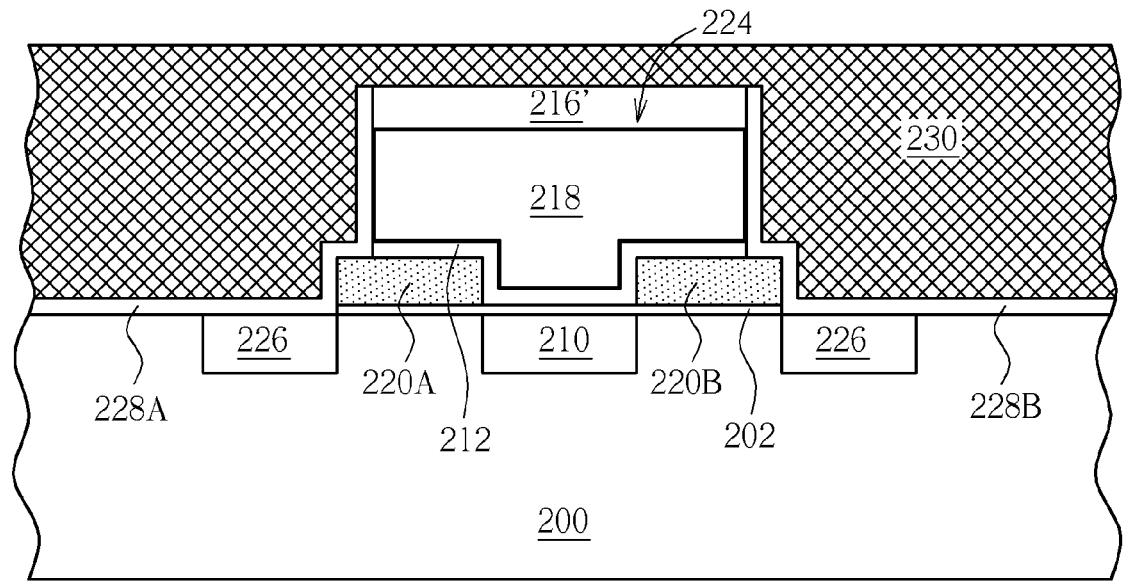
Figure 13:
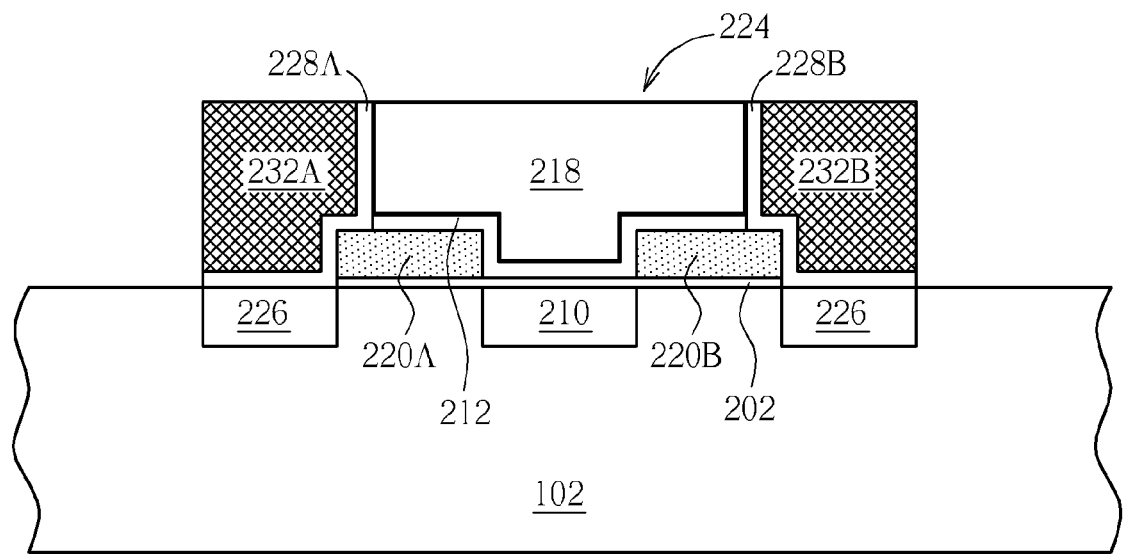

As shown in FIG. 12, two second dielectric layers 228A/228B made of high temperature oxide are formed through a thermal oxidation process; then, a third gate layer 230 is formed overall to cover the patterned mask layer 216', the second dielectric layers 228A/228B and both sides of the gate stack structure 224. The third gate layer 230 made of conductive materials such as polysilicon, metal silicide or a metal layer with specific work functions, such as polysilicon formed through a deposition process. Then, as shown in FIG. 13, a part of the third gate 230 is removed to form two select gates 232A/232B at both sides of the gate stack structure 224. The formation of the select gates 232A/232B includes the following steps. At first, a planarization process, such as an etching back process, is performed to partially remove the third gate layer 230 until the patterned mask layer 216' is exposed, and the height of the later formed select gate 232A/232B could be defined so that a planar top of the later formed select gate 232A/232B could be obtained. Subsequently, a lithography process is further performed to complete the formation of the select gates 232A/232B, and the size and the width of the select gate 232A/232B could be defined at this step. Accordingly, each of the formed select gates 232A/232B has a planar top and a reverse L-shaped structure, and partially overlaps each corresponding floating gate 220A/220B, the overlapped area is positively related to the illustrated area each of the sacrificial spacers 222 A/222B covered.

In this exemplary embodiment, the second dielectric layers 228A/228B including an inter-poly oxide (IPO) layer are respectively disposed between each of the select gates 232A/232B and each of the floating gates 220A/220B and between each of the select gates 232A/232B and the control gate 218 for electrical insulation, and the second dielectric layers 228A/228B do not overlap the top of the control gate 218. Moreover, the two floating gates 220A/220B are respectively surrounded by the gate dielectric layer 202, the first dielectric layer 212 and each of the second dielectric layers 228A/228B jointly.

Furthermore, in this exemplary embodiment, the floating gates 220A/220B, the control gate 218, and the select gate 232A/232B are all made of polysilicon, so the patterned mask layer 216' could be used as a mask and protection in the patterning process for forming the control gate 218 as shown in FIG. 9; the process for forming the sacrificial spacers 222 A/222B and the patterning process for forming the floating gates 220A/220B as shown in FIG. 10; the etching back process for removing the third gate layer 230 and the patterning process for forming the select gates 232A/232B as shown in FIG. 13. Accordingly, after the described processes are performed, the patterned mask layer 216' could be removed.

Figure 14:
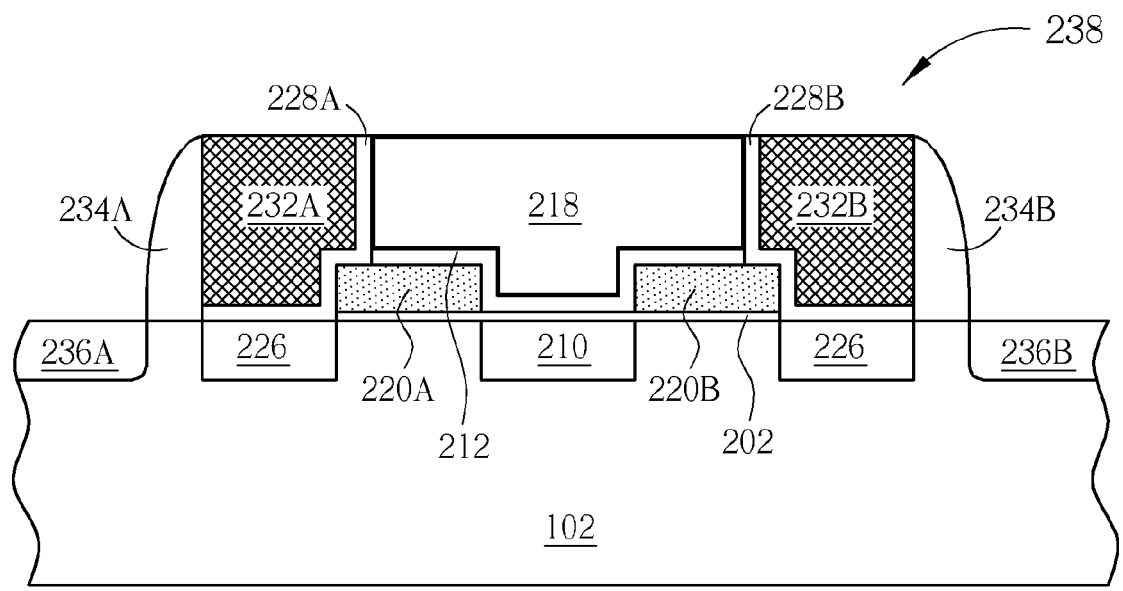

After the removal of the patterned mask layer 216', as shown in FIG. 14, two spacers 234A/234B are respectively formed at an outer side of each of the select gates 232A/232B, and an ion implantation process is further performed to form two second doped regions 236A/236B in the semiconductor substrate 200 at both sides of the gate stack structure 224. In this exemplary embodiment, the second doped regions 236A/236B may serve as source/drain regions, respectively electrically connected to a bit line (BL). Accordingly, the formation of the semiconductor device 238 is completed.

In other exemplar embodiments, the disposition of the select gates and the second dielectric layers may be different, and the select gates and the second dielectric layers may include different structures. The other exemplar embodiments are illustrated below, and in order to simplify the explanation, the same components are referred by using the same numerals as before, and only the differences are discussed while the similarities are not mentioned again.

Figure 15:
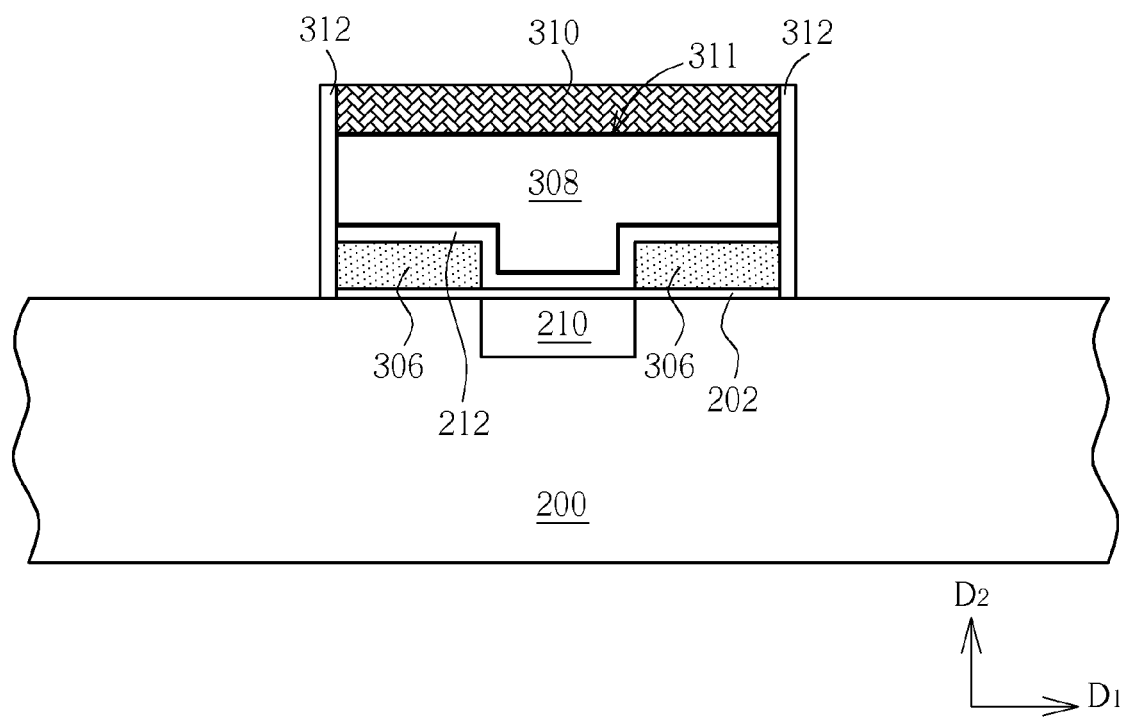
FIG. 15 through FIG. 19 are schematic diagrams illustrating a method of fabricating a semiconductor device according to another preferred exemplary embodiment of the present invention.

Please refer to FIG. 15 through FIG. 19, FIG. 15 through FIG. 19 are schematic diagrams illustrating a method of fabricating a semiconductor device according to another preferred exemplary embodiment of the present invention. At first, the manufacturing methods as illustrated above are performed to form the stack structure as shown in FIG. 7 and FIG. 8. Subsequently, as shown in FIG. 15, the mask layer 216, the second gate layer 214, the first dielectric layer 212, the first gate layer 204 and the gate dielectric layer 202 are patterned to form a patterned mask layer 310, a control gate 308 and two floating gates 306, and the opposite outer sidewalls S7/S8 of the two floating gates 306 are aligned with the outer sidewalls S9/S10 of the control gate 308. The patterning method includes the following steps. A lithography process is first carried out to form a patterned mask layer 310, and the patterned mask layer 310 layer may further serve as a mask to perform an etching process, such as an anisotropic etching process, to remove a part of the second gate layer 214 (for forming the control gate 308), a part of the first dielectric layer 212, a part of the first gate layer 204 (for forming the floating gates 306) and a part of the gate dielectric layer 202; or a patterned mask (not shown) is used, and an etching process is performed to partially remove the mask layer 216, the second gate layer 214, the first dielectric layer 212, the first gate layer 204 and the gate dielectric layer 202. Then, the control gate 308, the first dielectric layer 212, two floating gates 306 and the gate dielectric layer 202 covered by the patterned mask layer 310 could be defined as a gate stack structure 311.

Two spacers 312 are formed at the sidewalls of the gate stack structure 311, and the spacers 312 could include a single layered structure or a multi-layered structure, or also include a liner within. Furthermore, the material of the spacers 312 may include high temperature oxide (HTO), silicon nitride, silicon oxide or HexaChloroDisilane-SiN (HCD-SiN), but not limited thereto. In this exemplary embodiment, the spacers 312 may preferably be a planar stack structure made of different materials having different etching rate to the same etchant, for example, the spacers 312 could include a structure of liner-silicon nitride-silicon oxide. The processes of forming spacers 312 are known to those skilled in the art, the details are omitted herein for brevity.

Figure 16:
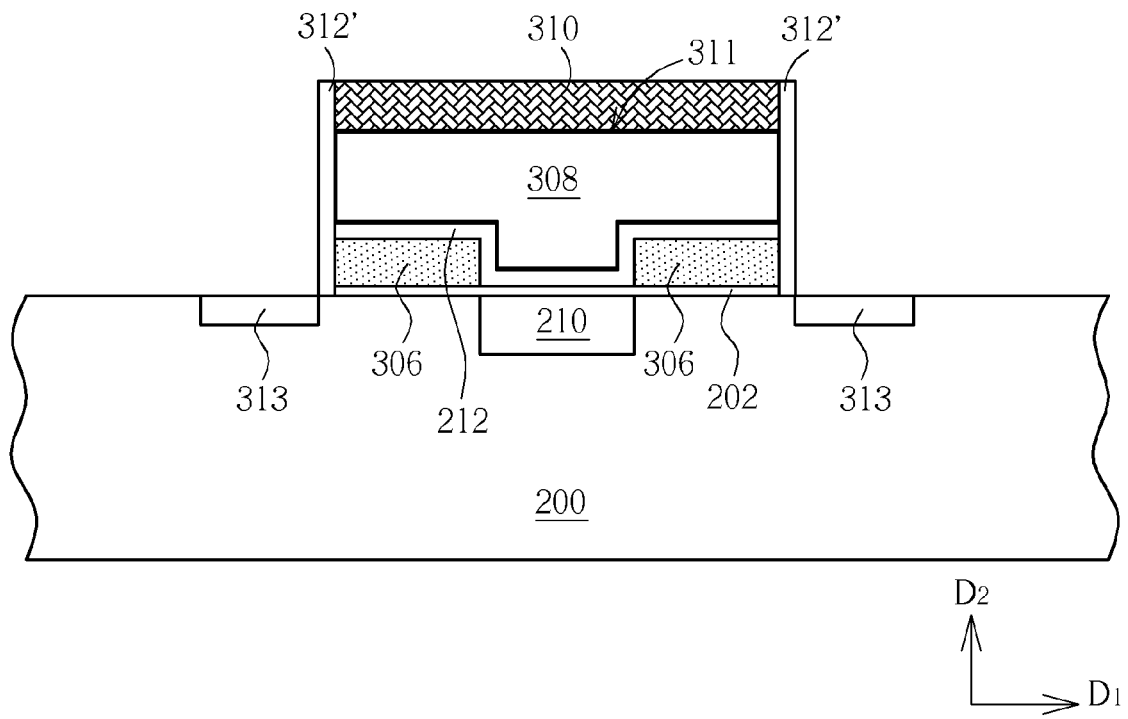

As shown in FIG. 16, doped region 313 can be selectively formed in the semiconductor substrate 200 at the two sides of the gate stack structure 311 for adjusting the performances of the later formed select gate. Subsequently, an etching process is performed to remove a part of the spacers 312 and the native oxide (not shown) on the semiconductor substrate 200 to expose the semiconductor substrate 200 at the two sides of the remaining spacers 312'. The remaining spacers 312' may include a structure of liner-silicon nitride.

Figure 17:
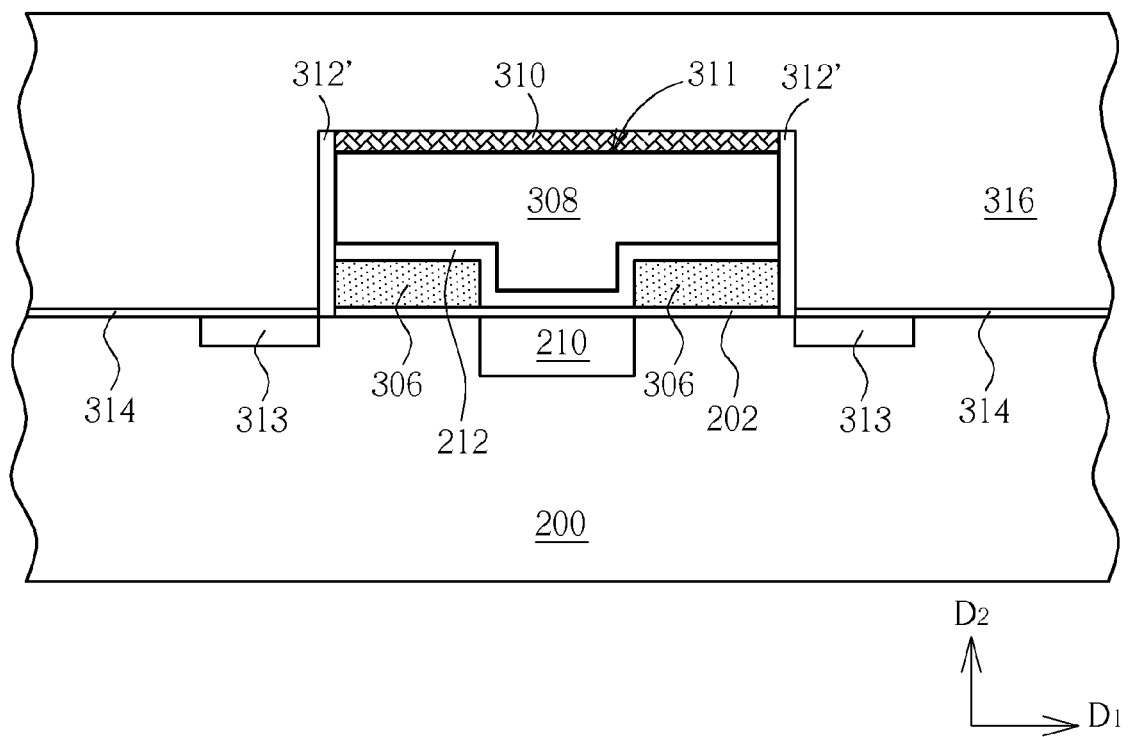

As shown in FIG. 17, a dielectric layers 314 made of silicon oxide are formed through a thermal oxidation process on the bared semiconductor substrate 200; then, a third gate layer 316 is formed overall to cover the patterned mask layer 310, the remaining spacers 312' and the dielectric layer 314. The third gate layer 316 made of conductive materials such as polysilicon, metal silicide or a metal layer with specific work functions, may include such as polysilicon formed through a deposition process.

Figure 18:
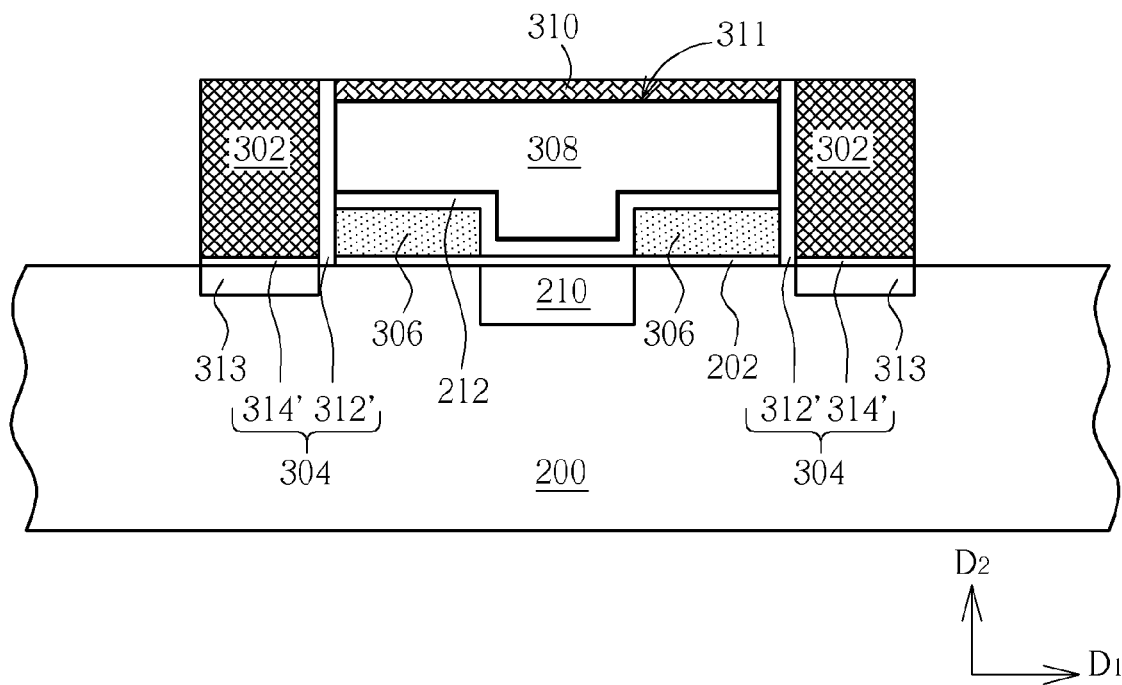

As shown in FIG. 18, a part of the third gate 316 and a part of the dielectric layer 314 are removed to form two select gates 302 at both sides of the gate stack structure 311. Additionally, the remaining dielectric layer 314' and the remaining spacers 312' may jointly serve as two second dielectric layers 304. The formation of the select gates 302 includes the planarization process and the lithography process as illustrated above to be performed sequentially, in order to determine the height and the width of the later formed select gates 302, and the details are omitted herein. It is appreciated that, the remaining dielectric layer 314' and the remaining spacers 312' are formed through different process, and not formed together, therefore, a thickness of each of the second dielectric layer 304 is generally not fixed. In other words, the vertical thickness of the second dielectric layer 304 (from the remaining spacers 312') is substantially different from the horizontal thickness of the second dielectric layer 304 (from the remaining dielectric layer 314').

Figure 19:
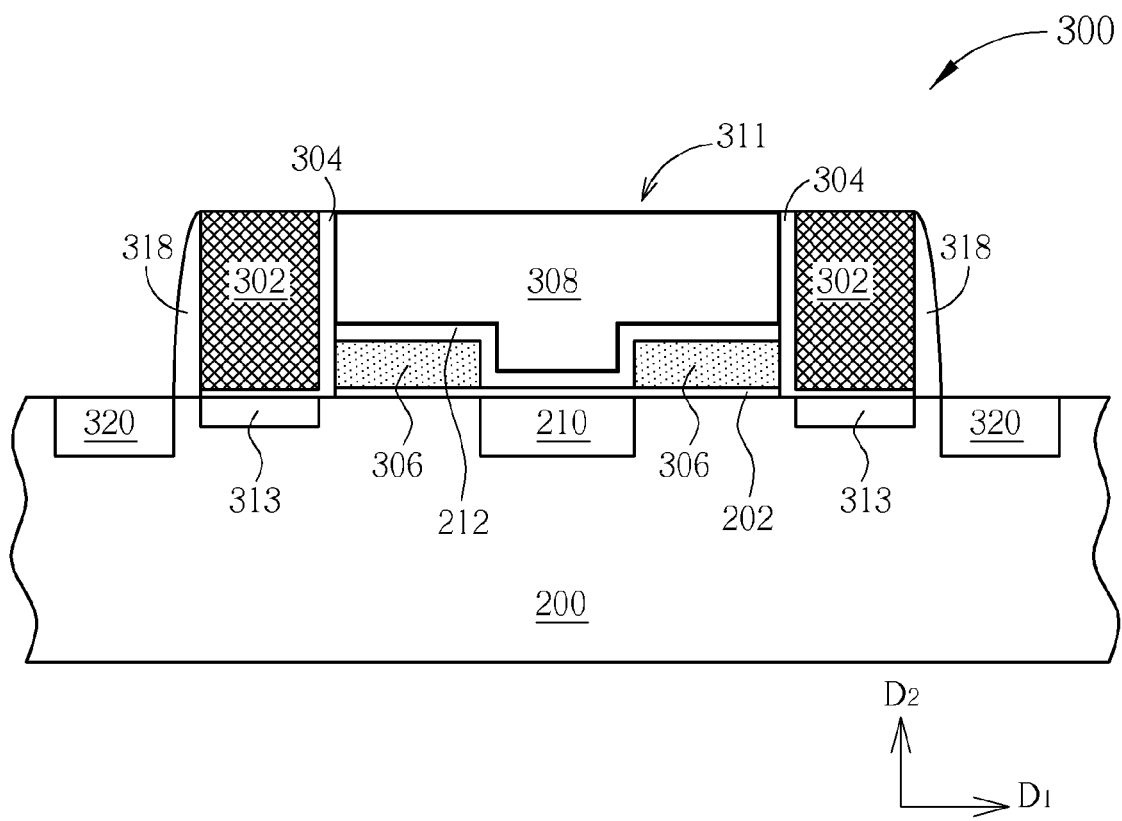

As shown in FIG. 19, the patterned mask layer 310 is removed, and two spacers 318 are respectively formed at an outer side of each of the select gates 302, and an ion implantation process is further performed to form two second doped regions 320 in the semiconductor substrate 200 at both sides of the gate stack structure 311. In this exemplary embodiment, the second doped regions 320 may serve as source/drain regions, respectively electrically connected to a bit line (BL). Accordingly, the formation of the semiconductor device 300 is completed.

Please refer to FIG. 19 again. Compared with the semiconductor device 100 illustrated as shown in FIG. 3, the materials and the relative location (at an outer side of the control gate 308 and each of the floating gates 306) of the select gates 302 of the semiconductor device 300 are similar to that of the select gates 112 of the semiconductor device 100. The differences are explained as below, in this exemplary embodiment, the opposite outer sidewalls S7/S8 of the two floating gates 306 are respectively aligned with the outer sidewall S9/S10 of the control gate 308, therefore, each of the select gates 302 has a strip-shaped cross-section, and does not overlap each of the floating gates 306. Furthermore, the thickness of the second dielectric layer 304 is not fixed, for example, an interval between each of the select gates 302 and the corresponding floating gate 306, or an interval between each of the select gates 302 and the T-shaped control gate 308 is different from an interval between each of the select gates 302 and the semiconductor substrate 200, in other words, a thickness of the second dielectric layer 304 along the second direction D2 is different from a thickness of the second dielectric layer 304 along the first direction D1.

Please refer to Table. 2. Table. 2 illustrates a reference of operation conditions of a semiconductor device according to another preferred exemplary embodiment of the present invention. As shown in Table. 2, as the semiconductor device 300 is selected to perform different operations, such as programming, erase or read, specific signals, such as voltage or current, are respectively applied to each of the terminals, such as the select gate 302, the second doped regions 320 electrically connected to BL, the first doped region 210 electrically connected to SL, the control gate 110 or a terminal electrically connected to the semiconductor substrate 200, to completed the operation. It is appreciated that, in this exemplary embodiment, the interval between each of the select gates 302 and the semiconductor substrate 200 in the semiconductor device 300 (the thickness of the second dielectric layer 304 along the first direction D1) as shown in FIG. 19 is smaller the interval between each of the select gates 112 and the semiconductor substrate 102 in the semiconductor device 100 (the thickness of the second dielectric layer 114 along the first direction D1) as shown in FIG. 3, which is beneficial to lower the operation voltage of the semiconductor device 300 in the operation of read. Moreover, as the semiconductor device 300 is selected to perform operation of erase, the difference of electric potential between the control gate 308 and the semiconductor substrate 200 could induce an electric field crossing through the gate dielectric layer 202. The hot electrons stored in the floating gates 306 may therefore get out through the gate dielectric layer 202 and be released through the semiconductor substrate 200, thereby achieving the erase operation.

TABLE 2

| | Operation Condition of Terminals | | | | |
|---|---|---|---|---|---|
| Operation | Select gate | Bit Line (BL) | Source Line (SL) | Control gate | Semiconductor substrate |
| Programming | 1 V | 1 μA | 3 V-4.5 V | 9 V-10 V | 0 V |
| Erase | 0 V | 0 V | 0 V | (−7 V)-(−10 V) | 8 V |
| Read | 1-1.8 V | 0.6-1 V | 0 V | 1.8 V | 0 V |

In conclusion, a T-shaped control gate of the present invention may simultaneously overlap a top and a sidewall of each of the two floating gates, contrary to the structure of the control gate only overlapping a top of a floating gate. The control gate structure design provided in the present invention can enlarge the overlapped area between the floating gate and the control gate, thereby increasing the GCR. Accordingly, the operation voltage of the semiconductor device may be reduced and the performances of the semiconductor device can be improved. Furthermore, only the first dielectric layer is conformally disposed between each of the floating gates and the control gate, and the first dielectric layer has a fixed thickness, so that an interval between each of the floating gates and the control gate is fixed, and a stable capacitance could be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
    sequentially forming a gate dielectric layer and a first gate layer on a semiconductor substrate, wherein the gate dielectric layer is between the first gate layer and the semiconductor substrate;
    forming at least an opening in the first gate layer;
    forming a first dielectric layer conformally on the semiconductor substrate wherein the first dielectric layer covers the first gate layer;
    forming a second gate layer filling the opening and overlapping the first gate layer; and
    removing a part of the second gate layer, a part of the first gate layer, and a part of the gate dielectric layer for forming a gate stack structure.

2. The method of fabricating a semiconductor device according to claim 1, wherein the opening exposes a part of the gate dielectric layer and does not expose the semiconductor substrate.

3. The method of fabricating a semiconductor device according to claim 1, further comprising forming a first doped region in the semiconductor substrate under the gate dielectric layer exposed by the opening.

4. The method of fabricating a semiconductor device according to claim 1, further comprising:
    forming two select gates disposed at both sides of the gate stack structure; and
    forming two second doped region in the semiconductor substrate at both sides of the gate stack structure.

5. The method of fabricating a semiconductor device according to claim 4,
    wherein the method of forming the gate stack structure comprises:
    forming a mask layer on the second gate layer;
    removing part of the mask layer and part of the second gate layer for forming a patterned mask layer and a control gate;
    forming two sacrificial spacers surrounding the control gate; and
    using the control gate and the sacrificial spacers as a mask, removing a part of the first gate layer to form two floating gates, wherein the control gate partially overlaps each of the floating gates.

6. The method of fabricating a semiconductor device according to claim 5, further comprising:
    forming a doped region adjacent to the two floating gates;
    removing the two sacrificial spacers;
    forming two second dielectric layers on the substrate, the doped region, part of the two floating gates, and sidewalls of the control gate;
    forming a third gate layer on the patterned mask layer and the two second dielectric layers; and
    removing part of the third gate layer for forming the two select gates.

7. The method of fabricating a semiconductor device according to claim 4, further comprising:
    forming two spacers adjacent to the two select gates; and
    forming the two second doped regions in the semiconductor substrate adjacent to the two spacers.

8. The method of fabricating a semiconductor device according to claim 1, further comprising:
    forming a mask layer on the second gate layer; and
    removing a part of the mask layer, a part of the second gate layer, a part of the first dielectric layer, a part of the first gate layer, and a part of the gate dielectric layer for forming a patterned mask layer, a control gate, and two floating gates, wherein the opposite outer sidewalls of the two floating gates are aligned with outer sidewalls of the control gate.

9. The method of fabricating a semiconductor device according to claim 8, further comprising:
    forming two first spacers on the sidewalls of the two floating gates, the control gate, and the patterned mask layer;
    forming two doped regions in the semiconductor substrate adjacent to the two first spacers;
    removing part of the two first spacers to expose the semiconductor substrate;
    forming a dielectric layer on the exposed semiconductor substrate;
    forming a third gate layer on the dielectric layer and the patterned mask layer; and
    removing part of the third gate layer for forming the two select gates.

10. The method of fabricating a semiconductor device according to claim 9, further comprising:
    removing the patterned mask layer;
    forming two second spacers adjacent to the two select gates; and
    forming the two second doped regions in the semiconductor substrate adjacent to the two second spacers.

* * * * *